(12) United States Patent
Takahashi

(10) Patent No.: US 6,771,548 B2
(45) Date of Patent: Aug. 3, 2004

(54) SEMICONDUCTOR MEMORY DEVICE

(75) Inventor: Shuichi Takahashi, Ora-Gun (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/384,792

(22) Filed: Mar. 11, 2003

(65) Prior Publication Data

US 2003/0218922 A1 Nov. 27, 2003

(30) Foreign Application Priority Data

Mar. 12, 2002 (JP) ........................................ 2002-066623

(51) Int. Cl.[7] .............................................. G11C 7/00
(52) U.S. Cl. ....................................... 365/194; 365/203
(58) Field of Search .................................. 365/194, 203

(56) References Cited

U.S. PATENT DOCUMENTS 5,297,091 A  *  3/1994 Blake et al. ................. 365/203

* cited by examiner

Primary Examiner—M. Tran
(74) Attorney, Agent, or Firm—Morrison & Foerster LLP

(57) ABSTRACT

A semiconductor memory device of this invention enables high rate readout of stored data without read failure. The semiconductor memory device has a group of memory transistors including a plurality of memory transistors connected in series and a data readout line, through which data stored in the memory transistors is outputted. A sense amplifier is connected to the data readout line. The data readout line is pre-charged to a first electric potential by a transistor for pre-charge. A first transistor for keeping voltage controlled by the sense amplifier is connected to the data readout line, and a second transistor for keeping voltage is connected between the first transistor for keeping voltage and a node at the first electric potential. Furthermore, the semiconductor memory device of this invention has a delay circuit generating a delay signal to turn on the second transistor for keeping voltage, after pre-charging by the transistor for pre-charge is completed.

8 Claims, 4 Drawing Sheets

SEMICONDUCTOR MEMORY DEVICE

BACKGROUND OF THE INVENTION

1. Field of the Invention

This invention relates to a semiconductor memory device, specifically to a read only memory (hereafter referred to as a ROM).

2. Description of the Related Art

A mask ROM is a type of ROM, into which data is programmed during a manufacturing process using a photo mask. Programming methods include a diffusion layer programming, an ion implantation programming, a contact hole programming and so on. Generally speaking, the ion implantation programming can make the area per bit of the mask ROM smaller than shoes of the other programming methods. In particular, the area per bit of a mask ROM, which includes a plurality of memory transistors connected in series, is very small. Such a ROM is referred to as a stacked ROM hereinafter.

FIG. 4A and FIG. 4B are equivalent circuit diagrams of the stacked ROM. A group of memory transistors 10 includes four P-channel type memory transistors 1A, 1B, 1C and 1D connected in series. The group of memory transistors 10 is connected to a bit line BL. Gates of the memory transistors 1A, 1B, 1C and 1D are connected to word lines. The word lines are provided with outputs of a row decoder which is not shown in the figure.

The memory transistors 1A, 1B, 1C and 1D can be either an enhancement type or a depletion type depending on the selective ion implantation using a photo mask. Hereby each bit of data is programmed into each of the memory transistors 1A, 1B, 1C and 1D. In this example, it is assumed that the memory transistors 1B and 1D are depletion type while the memory transistors 1A and 1C are enhancement type. An enhancement type transistor has a normal threshold voltage. A depletion type transistor is always turned on regardless a voltage applied to its gate, since impurities of the same conductivity type as its source and drain are ion implanted into its channel.

In order to read the programmed data, first a pre-charge signal PC is set to high level so that an N-channel type MOS transistor 2 for pre-charge is turned on and a P-channel type MOS transistor 3 for readout power supply is turned off. At this time, all word lines are set to low level, thus all of the memory transistors 1A, 1B, 1C and 1D are turned on.

After that, the P-channel type MOS transistor 3 for readout power supply is turned on and the N-channel type MOS transistor 2 for pre-charge is turned off by turning the pre-charge signal PC low. Then a word line applied to a selected memory transistor is turned to high level while the other word lines are kept at low level. Herewith, reading of the data takes place.

When the memory transistor 1A is selected, the word line connected to its gate is turned to high level, as shown in FIG. 4A. The memory transistor 1A is turned off because it is enhancement type. Thus, a data readout line 6 connected to the pre-charge transistor 2 keeps low level (0V). And the stored data "0" of low level is latched with a latch circuit 19 through a sense amplifier 8. A voltage holding circuit 7 includes the sense amplifier 8 having an inverter and an N-channel type transistor 9 for keeping low level. The voltage holding circuit 7 is a circuit to hold the pre-charge level (0V) of the data readout line 6 stable. An output of the sense amplifier 8 is applied to a gate of the transistor 9 for keeping low level, while its drain is connected to the data readout line 6 and its source is grounded.

When the memory transistor 1B is selected, the word line connected to its gate is turned to high level, as shown in FIG. 4B. The memory transistor 1B is turned on because it is depletion type. The other memory transistors 1A, 1C and 1D are turned on because their gates are at low level. Therefore, a charging current I flows from the transistor 3 for readout power supply through the group of the memory transistors 10 and a column decoder 4, turning the data readout line 6 from low level to high level. And the stored data "1" of high level is latched with a latch circuit 19 through a sense amplifier 8.

However, the voltage holding circuit 7 causes a conflict over the level when the high level stored data "1" is read out from the memory transistor. That is, while the charging current I pushes the data readout line 6 to high level, a current flowing through the transistor 9 for keeping low level pulls the data readout line 6 to low level on the other hand, since the transistor 9 for keeping low level is turned on at the beginning of readout. For this reason, raising voltage of the data readout line 6 takes time, reducing reading rate for the high level stored data "1". With this being the case, the transistor 9 for keeping low level has been designed to have high impedance in the conventional art.

When the impedance of the transistor 9 for keeping low level is high, however, there is a problem in reading a low level stored data "0" that the ability to keep low level is weakened, and the voltage holding circuit 7 is made vulnerable to a leakage current in a memory transistor, which flows into the data readout line 6 to change the low level to high level.

In addition, when the impedance of the transistor 9 for keeping low level is increased, the area of its gate is also increased, adding more oxide capacitance for the transistor 9 for keeping low level to charge. Therefore, when the high level stored data "1" is read out (while the transistor 9 for keeping low level is turned on), it takes longer time for the data readout line 6 to turn from low level to high level, thus making high rate readout impossible.

SUMMARY OF THE INVENTION

The invention provides a semiconductor memory device including a plurality of memory transistors connected in series, a data readout line to which data stored in the memory transistors is outputted, a pre-charging transistor pre-charging the data readout line to a first electric potential, and a sense amplifier connected to the data readout line. The device also includes a first holding transistor connected to the data readout line and controlled by an output of the sense amplifier, a second holding transistor connecting the first holding transistor and a voltage source at the first electric potential, and a delay circuit applying to the second holding transistor a signal for turning on the second holding transistor at a predetermined time after a start of a pre-charging of the data readout line by the pre-charging transistor.

DETAILED DESCRIPTION OF THE INVENTION

The first embodiment of a semiconductor memory device according to this invention will be explained referring to the FIGS. 1–2B hereinafter.

Figure 1:
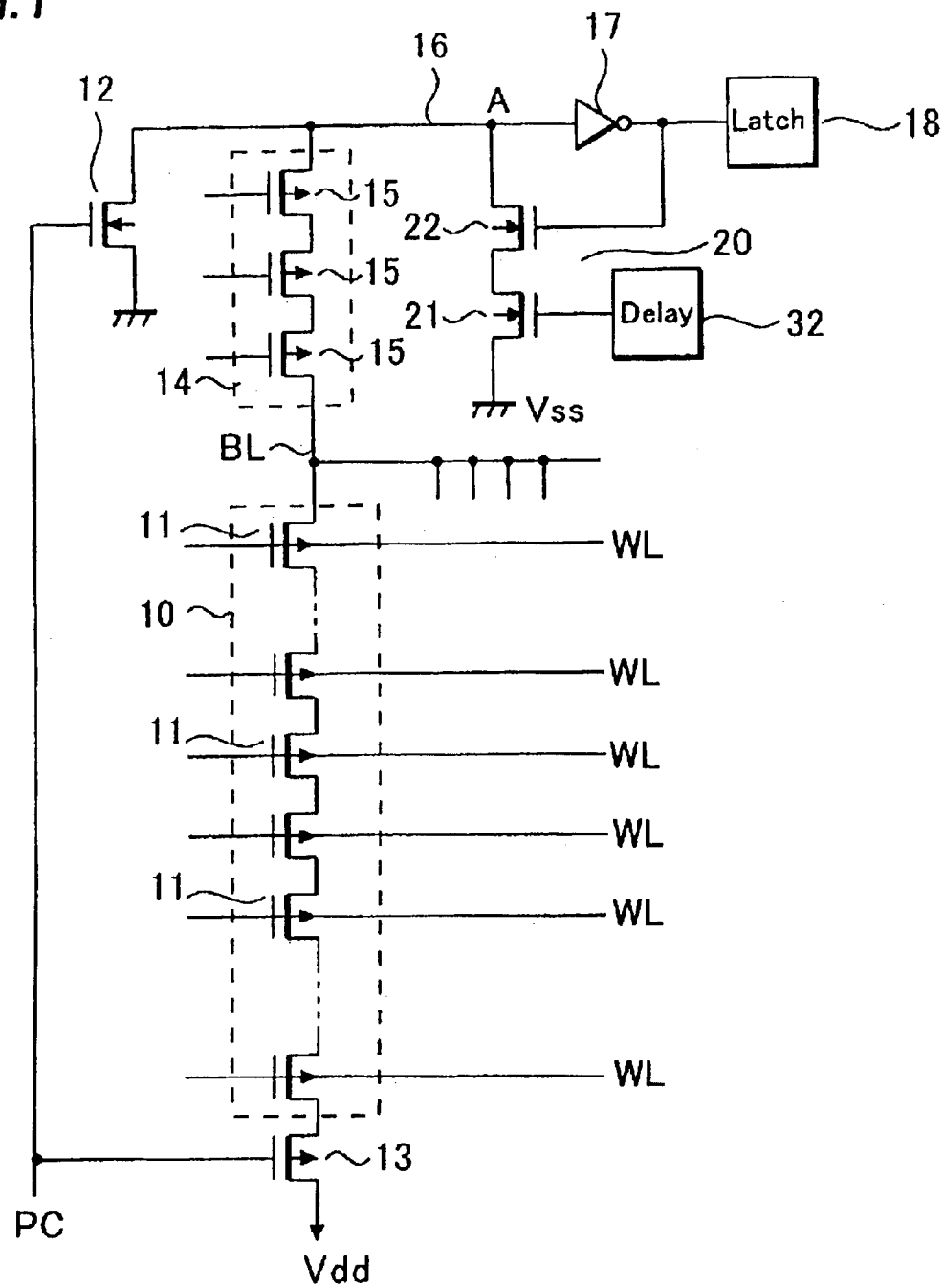
FIG. 1 shows a circuit diagram of a semiconductor memory device of a first embodiment of this invention.
Figure 4A:
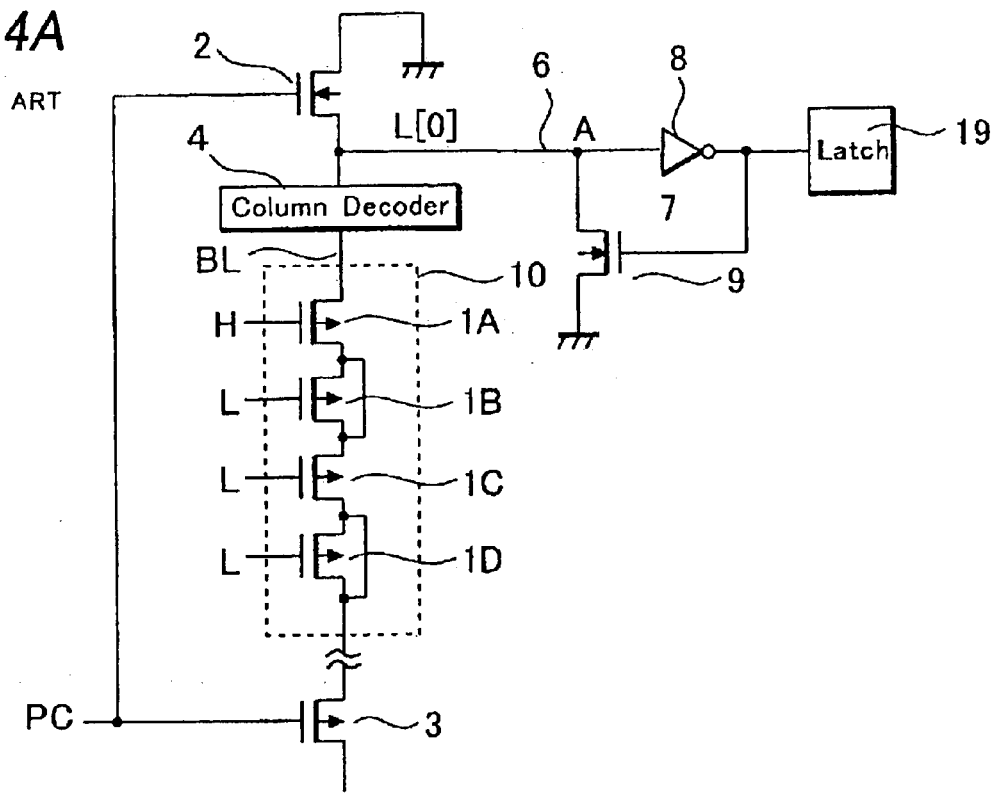
FIGS. 4A and 4B show circuit diagrams of a conventional semiconductor memory device.
Figure 4B:
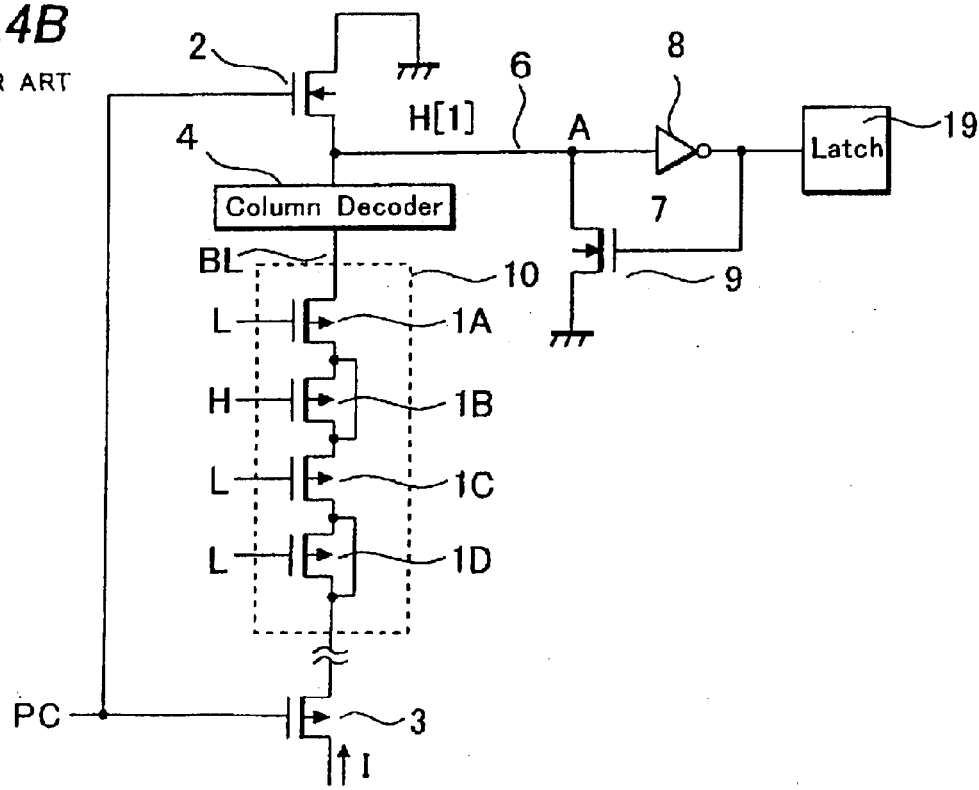

FIG. 1 shows an outline of an equivalent circuit diagram of the semiconductor memory device of this embodiment. The programming methods of the stacked ROM of this embodiment are those described with reference to FIGS. 4A and 4B.

A group of memory transistors 10 includes a plurality of memory transistors 11 (P-channel type MOS transistors) connected in series, as shown in FIG. 1. The group of memory transistors 10 is connected to a bit line BL. Pre-charge signal PC is inputted to a gate of an N-channel type MOS transistor 12 for pre-charge and a gate of a P-channel type MOS transistor 13 for readout power supply. Although the transistor 12 for pre-charge operates to discharge a data readout line 16 and works as a pre-discharge transistor, it is referred to as a transistor for pre-charge in a broader sense.

A column decoder 14 includes a plurality of P-channel type MOS transistors 15 connected in series, and is connected to the group of memory transistors 10 in series. Column address data is applied to the MOS transistors 15.

The transistor 12 for pre-charge and the column decoder 14 are connected to a data readout line 16. Data ("0", "1") stored in the group of stacked memory transistors 10 is transferred through the data readout line 16 to a sense amplifier 17, and the data amplified by the sense amplifier 17 is kept temporary in a latch circuit 18.

A numeral 20 denotes an improved voltage holding circuit. The voltage holding circuit 20 includes a first transistor 22 (N-channel type MOS transistor) that is used to hold low level, and a second transistor 21 (N-channel type MOS transistor) that is also used to hold low level and connected with the first transistor 22 in series. The gate of the first transistor 22 receives an output of the sense amplifier 17, and its drain is connected to a node A of the data readout line 16. The gate of the second transistor 21 receives an output of the delay circuit 32. The source of the second transistor 21 is connected to a ground potential (0V), which is the same as the pre-charge potential. The ground potential may be a predetermined reference voltage, which is not 0 volt.

The voltage holding circuit 20 operates so that the second transistor 21 turns on with a predetermined time of delay after the transistor 12 for pre-charge is turned from ON to OFF and the reading of the data from the memory transistors 11 starts. The delay circuit 32 generates a signal to turn on the second transistor 21 with the delay. The signal rises with the predetermined time of delay after the pre-charge signal turns to low level. Preferably, the signal rises to high level after the data outputted to the data readout line 16 is established.

The readout operation of the semiconductor memory device will be explained hereinafter. It is assumed that the transistor 12 for pre-charge turns from OFF state to ON state. It is also assumed that the level of the word lines WL is well established and the column decoder 14 is conducting.

Now, reading a low level data "0" stored in the memory transistor 11 is described. In this case, the data readout line 16 has been discharged to low level by the transistor 12 for pre-charge, as in the case of the conventional device. In the voltage holding circuit 20, the sense amplifier 17 converts the low level voltage to a high level voltage, which turns on the first transistor 22. After that, a high level signal from the delay circuit 32 turns on the second transistor 21. With this, the voltage holding circuit 20 begins low level holding operation to keep the low level voltage of the data readout line 16.

Next, reading a high level data "1" stored in the memory transistor 11 is considered.

In this case, the first transistor 22 is ON and the second transistor 21 is OFF at the start of the readout. Then, the stored high level data "1" is outputted from the memory transistor 11, through the bit line BL and the column decoder 14, to the data readout line 16. The data readout line 16 rapidly rises to high level which turns the output of the sense amplifier 17 to low level, while the voltage holding circuit 20 does not begin the holding operation. Herewith the high level stored data "1" is established.

The first transistor 22 is turned off with this. Therefore, the low level holding function of the voltage holding circuit 20 does not operate when the second transistor 21 is turned on later with a high level signal from the delay circuit 32, since the first transistor 22 is turned off by that time. As a result, the reading rate of the high level stored data "1" can be improved, even when the impedance of the first transistor 22 and the second transistor 21 are reduced.

Also the low level holding function in reading low level stored data "0" can be improved, as a result of that the impedance of the first transistor 22 and the second transistor 21 are reduced.

Figure 2A:
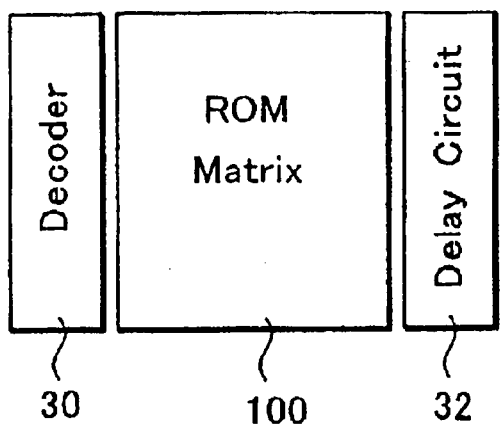
FIGS. 2A and 2B show a delay circuit of the semiconductor memory device of FIG. 1.
Figure 2B:
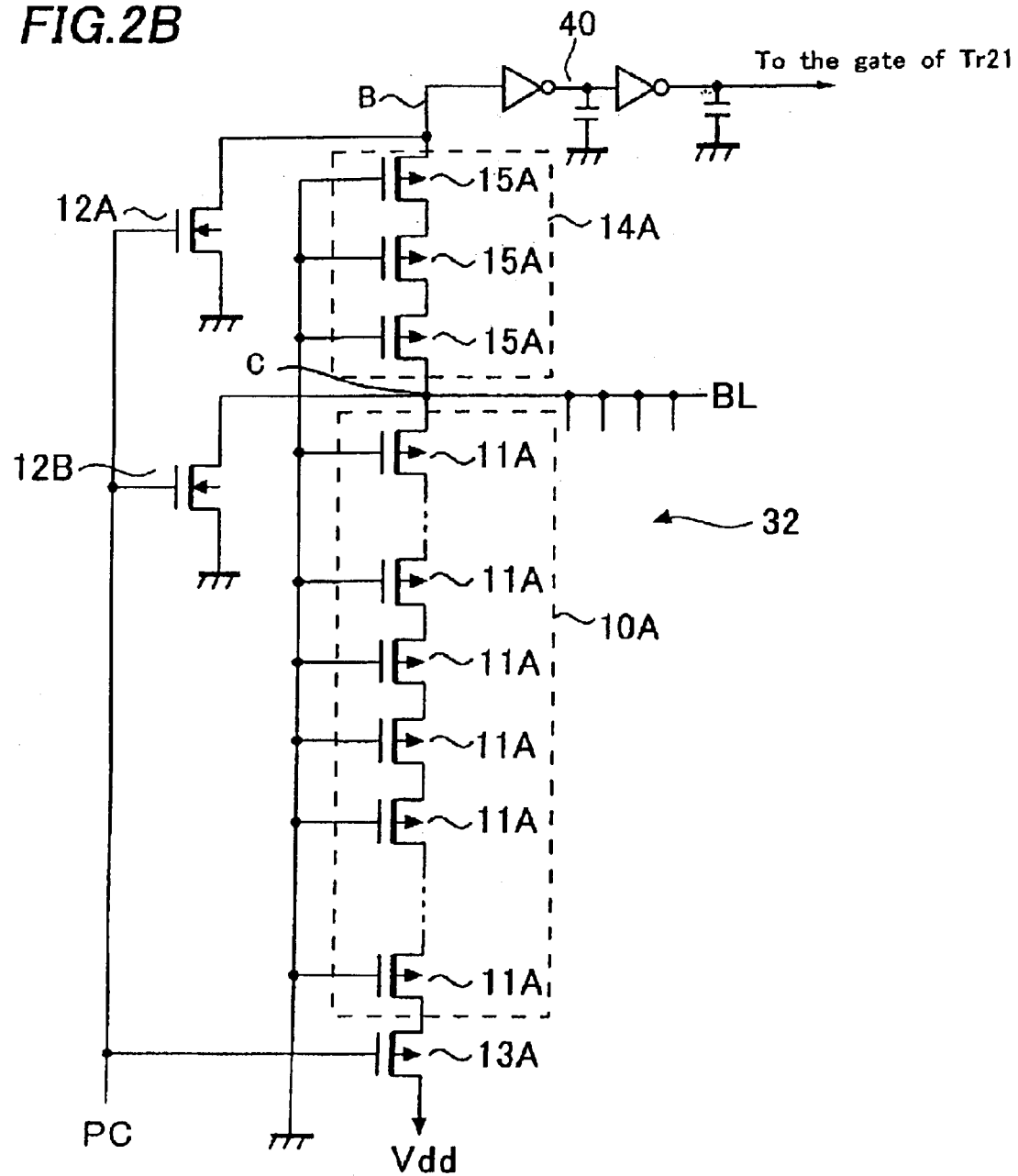

Next, configuration of the delay circuit 32, which provides the second transistor 21 in the voltage holding circuit 20 with an output signal, will be explained referring to FIG. 2A and FIG. 2B. FIG. 2A shows a block diagram of the semiconductor memory device including the delay circuit 32, and FIG. 2B shows an equivalent circuit diagram of the delay circuit 32.

The semiconductor memory device has a ROM matrix 100 including the memory transistors 10, a decoder 30 to access a predetermined address of the ROM matrix and the delay circuit 32 disposed adjacent the ROM matrix 100, as shown in FIG. 2A. The decoder 30 includes a column decoder and a row decoder.

The delay circuit 32 includes a first delay circuit having a group of memory transistors and a second delay circuit connected to it in series.

The first delay circuit is explained first. A group of MOS transistors 10A includes a plurality of P-channel type MOS transistors 1A connected in series, as shown in FIG. 1. The group of MOS transistors 10A is preferably larger in the number of transistors than the group of memory transistors 10 in order to obtain a longer delay time than that of the group of memory transistors 10. The P-channel type MOS transistors 11A may be either enhancement type or depletion type.

The group of MOS transistors 10A is connected to the bit line BL, and connected with a group of MOS transistors 14A which corresponds to the column decoder 14 in FIG. 1. The group of MOS transistors 14A includes a plurality of P-channel type MOS transistors 15A connected in series.

The gates of the transistors 11A and the gates of the transistors 15A are provided with the ground voltage (0V) in common so that all the transistors are always turned on. An N-channel type MOS transistor 12A for pre-charge is connected to one end (node B) of the group of transistors 14A.

An N-channel type MOS transistor 12B is connected to a connecting node (node C) between the group of transistors 14A and the group of transistors 10A. A P-channel type MOS transistor 13A for power supply is connected to an end of the group of transistors 10A. The pre-charge signal PC is applied to gates of the transistors 12A and 12B for pre-charge and of the transistor 13A for power supply.

Although not shown in the figure, one end (node B) of the group of transistors 14A corresponds to the data readout line 16, and connected with a dummy sense amplifier and a dummy voltage holding circuit. With this, the same amount of parasitic capacitance as the parasitic capacitance of the data readout line 16 is attached to the node B.

Next, the second delay circuit 40 is explained. The second delay circuit 40 includes a plurality of stages of inverters with capacitors connected to their outputs. Larger delay time can be obtained by increasing the number of the stages. The second delay circuit 40 is connected to one end (node B) of the group of transistors 14A. The output of the second delay circuit 40 is connected to the gate of the second transistor 21 in the voltage holding circuit 20.

Next, the operation of the delay circuit 32 is explained. First, the transistors 12A and 12B for pre-charge are turned on and the transistor 13A for power supply is turned off when the pre-charge signal PC is set to high level. With this, the nodes B and C are set to the ground voltage (0V). The transistor 12A for pre-charge and the transistor 13B for power supply are similar to those in FIG. 1.

Then reading data from the group of memory transistors 10 begins when the pre-charge signal PC is turned to low level to terminate the pre-charge. In the delay circuit 32, at that time, the transistor 13A for power supply is turned on and a current flows from the transistor 13A for power supply to the groups of transistors 10A and 14A. As a result, voltages at the nodes B and C begin rising from 0V.

If the group of MOS transistors 10A is larger in number of transistors than the group of transistors 10, the rise of the voltages at the nodes B and C is delayed longer. The rise time of the node C is made even longer because the transistor 12B for pre-charge added to the transistor 12A for pre-charge sets the node C at 0V initially. Also, because of the second delay circuit 40, the high level signal to the second transistor 21 in the voltage holding circuit 20 is delayed even further.

Using the output signal of the delay circuit 32 enables turning on the second transistor 21 at a predetermined time of delay after reading data from the memory transistors 11 starts, and making the voltage holding circuit 20 functional. Also a signal which rises after the data outputted from the memory transistors 11 to the data readout line 16 is established can be easily generated, since the delay time can be varied to meet specific requirements by changing the number of transistors in the groups of transistors 10A and 14A and the number of the stages in the second delay circuit 40.

It is also possible to use the first delay circuit only or the second delay circuit 40 only as the delay circuit 32.

Figure 3:
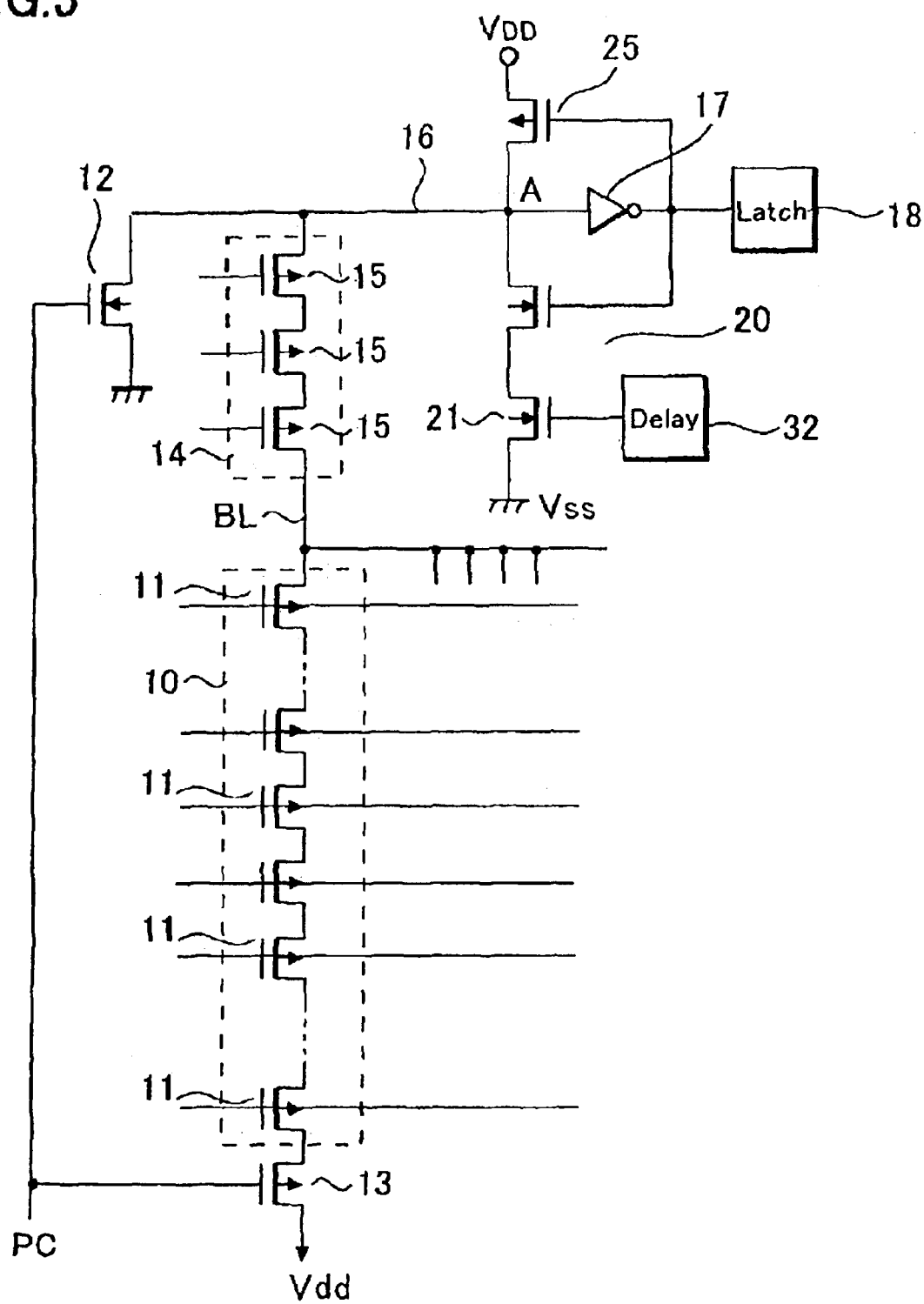
FIG. 3 shows a circuit diagram of a semiconductor memory device of a second embodiment of this invention.

The second embodiment of this invention, which enables high rate readout with the semiconductor memory device, is explained referring to FIG. 3. The same symbols and reference numerals are used to identify the same components as in the first embodiment.

A P-channel type MOS transistor 25, which is used to hold high level, is added as shown in FIG. 3, according to this embodiment. The output of the sense amplifier 17 is inputted to the gate of the transistor 25 for keeping high level, the source of which is connected to the power supply VDD and the drain of which is connected to the data readout line 16.

When the high level stored data "1" is read through the data readout line 16 and the voltage of the data readout line 16 exceeds a threshold voltage of the sense amplifier 17, the output of the sense amplifier 17 falls from high level to low level. The low level signal is inputted to the gate of the transistor 25 for keeping high level. Then the transistor 25 for keeping high level is turned on, and the voltage from the power supply VDD is applied to the data readout line 16. As a result, the level of the data readout line 16 turns rapidly to high level. Consequently the output of the sense amplifier 17 falls rapidly to low level (0V). Hence it is made possible to read the high level stored data "1" rapidly.

While the group of memory transistors 10 of these embodiments include P-channel type memory transistors 11, they may include N-channel type MOS transistors.

What is claimed is:

1. A semiconductor memory device comprising:
   a plurality of memory transistors connected in series;
   a data readout line to which data stored in the memory transistors is outputted;
   a pre-charging transistor pre-charging the data readout line to a first electric potential;
   a sense amplifier connected to the data readout line;
   a first holding transistor connected to the data readout line and controlled by an output of the sense amplifier;
   a second holding transistor connecting the first holding transistor and a voltage source at the first electric potential; and
   a delay circuit applying to the second holding transistor a signal for turning on the second holding transistor at a predetermined time after a start of a pre-charging of the data readout line by the pre-charging transistor.

2. The semiconductor memory device of claim 1, wherein the predetermined time is after a completion of the pre-charging.

3. The semiconductor memory device of the claim 2, wherein the predetermined time is after a completion of outputting of the data stored in the memory transistors to the data readout line.

4. The semiconductor memory device of the claim 2, wherein the delay circuit comprises a plurality of transistors connected in series.

5. The semiconductor memory device of the claim 3, wherein the delay circuit comprises a plurality of transistors connected in series.

6. The semiconductor memory device of the claim 2, wherein the delay circuit comprises an inverter and a capacitor connected to an output of the inverter.

7. The semiconductor memory device of the claim 3, wherein the delay circuit comprises an inverter and a capacitor connected to an output of the inverter.

8. The semiconductor memory device of the claim 2, further comprising a third holding transistor connected to the data readout line and controlled by an output of the sense amplifier, the third holding transistor being adopted to hold the data readout line at a second electric potential.

\* \* \* \* \*